United States Patent [19]
Lur et al.

[11] Patent Number: 5,465,003
[45] Date of Patent: Nov. 7, 1995

[54] PLANARIZED LOCAL OXIDATION BY TRENCH-AROUND TECHNOLOGY

[75] Inventors: Water Lur, Taipei; Anna Su; Neng H. Shen, both of Hsing-Chu, all of Taiwan

[73] Assignee: United Microelectronics Corporation, Hsinchu, Taiwan

[21] Appl. No.: 347,674

[22] Filed: Dec. 1, 1994

Related U.S. Application Data

[62] Division of Ser. No. 127,061, Sep. 27, 1993, Pat. No. 5,372,968.

[51] Int. Cl.$^6$ .............................. H01L 29/00; H01L 23/58
[52] U.S. Cl. .......................... 257/510; 257/513; 257/519; 257/635; 257/638
[58] Field of Search ..................................... 257/510, 513, 257/519, 635, 638, 647, 648

[56] References Cited

U.S. PATENT DOCUMENTS

| | | | |
|---|---|---|---|
| 4,211,582 | 7/1980 | Horng et al. | 148/1.5 |
| 4,656,497 | 4/1987 | Rogers et al. | 357/50 |
| 4,836,885 | 6/1989 | Breiten et al. | 156/643 |
| 4,868,136 | 9/1989 | Ravaglia | 437/38 |
| 4,876,216 | 10/1989 | Tobiao et al. | 437/67 |
| 4,988,639 | 1/1991 | Aomura | 437/67 |
| 5,017,999 | 5/1991 | Roisen et al. | 357/49 |
| 5,096,848 | 3/1992 | Kawamura | 437/67 |
| 5,108,946 | 4/1992 | Zdebel et al. | 437/72 |
| 5,130,268 | 7/1992 | Liou et al. | 437/67 |
| 5,350,941 | 9/1994 | Madan | 257/510 |

OTHER PUBLICATIONS

VLSI Technology, International Edition, by Sinsze McGraw-Hill Book Co, NY N.Y. ©1988, by McGraw-Hill Book Co, pp. 473–474, 476–477.
"Formation of Silicon Nitride at Si-SiO$_2$ Interface during Local Oxidation and during Heat-Treatment of Oxidized Silicon in NH$_3$ Gas" by E. Kooi, .
J. G. van Lierop & J. A. Appeals, J. Electrochem Soc. Solid-State Science and Technology, Jul. 1976, pp. 1117–1120.

*Primary Examiner*—Steven H. Loke
*Attorney, Agent, or Firm*—George O. Saile; Rosemary L. S. Pike

[57] ABSTRACT

A new planarized device isolation structure within a semiconductor substrate is described. The device isolation structure comprises narrow device isolation regions each consisting of a deep trench having a thin oxide covering its sidewalls and bottom and filled with silicon oxide, wide device isolation regions each consisting of two deep trenches flanking a shallow trench wherein each deep trench has a thin oxide covering its sidewalls and bottom and is filled with silicon oxide and wherein the shallow trench is filled with a field oxide. The top surface of the narrow and wide device isolation regions and the semiconductor substrate is planarized.

10 Claims, 2 Drawing Sheets

PLANARIZED LOCAL OXIDATION BY TRENCH-AROUND TECHNOLOGY

This application is a division of application Ser. No. 08/127,061, filed Sep. 27, 1993, now U.S. Pat. No. 5,372,968.

BACKGROUND OF THE INVENTION

1. Field of the Invention

This invention relates to the fabrication of integrated circuit devices and more particularly to a method of local oxidation using trench-around technology in the fabrication of integrated circuits.

2. Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, New York, N.Y., ©1988 by McGraw-Hill Book Co., pp. 473–474. A layer of silicon nitride is deposited over a pad oxide overlying a silicon substrate. The pad oxide is a thin thermal oxide which allows better adhesion between the nitride and silicon and acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

On pp. 476–477 of the aforementioned textbook, Sze describes some of the disadvantages of the growth of field oxide using the local oxidation method. The field oxide will penetrate under the masking nitride layer causing the space between transistors to grow during oxidation. This oxide growth under nitride is called "bird's beak encroachment." Other problems include stress in the oxide in the region covered by the nitride mask, white ribbon effect (a narrow region of nonoxidized silicon), thinning of the field oxide in narrow openings, and a non-recessed surface.

Many new isolation processes have been developed to overcome these drawbacks. Trench isolation schemes are the most attractive candidates. Typically, deep narrow trenches are used to isolate one device from another. Shallow trenches are used to isolate elements within a device, and wide trenches are used in areas where interconnection patterns will be deposited. Unfortunately, simple trench isolation methods cannot be implemented on large area openings. A number of solutions to this problem have been proposed. U.S. Pat. Nos. 4,836,885 to Breiten et al and 4,876,216 to Tobias et al describe methods for overcoming trench isolation problems using resist etchback techniques. U.S. Pat. No. 4,656,497 to Rogers et al uses reflow of doped glass at high temperatures. U.S. Pat. Nos. 5,017,999 to Roisen et al, 5,108,946 to Zdebel et al, and 5,130,268 to Liou et al describe using reoxidation of solid-phase growth polysilicon. U.S. Pat. Nos. 4,211,582 to Horng et al and 4,988,639 to Aomura use two step oxidation with plurality mask techniques and U.S. Pat. Nos. 4,868,136 to Ravaglia and 5,096,848 to Kawamura describe a combination of LOCOS and trench techniques. However, in each of these processes there exist some inherent drawbacks such as productivity, repeatability, complexity, and maturity, as well as global planarization.

SUMMARY OF THE INVENTION

A principal object of the invention is to provide an effective and very manufacturable method to locally oxidize the silicon in an integrated circuit.

Another object of the present invention is to provide a method of local oxidation of silicon that will have no "bird's beak" or white ribbon effect.

Yet another object is to provide a method of local oxidation which is free of oxide thinning in narrow openings.

Yet another object of the invention is to provide a method of locally oxidizing the silicon in an integrated circuit whereby a minimum of stress is generated.

Yet another object is to provide a method of local oxidation which incorporates global planarization.

In accordance with the objects of this invention, a new method of local oxidation using trench-around technology is achieved. A first silicon oxide layer is deposited over the surface of a silicon substrate. A plurality of wide and narrow openings are etched through portions of the first silicon oxide layer not covered by a mask pattern to the silicon substrate. A first layer of silicon nitride is deposited overlying the patterned first silicon oxide layer and etched to form a first set of spacers on the sidewalls of the patterned first silicon oxide layer whereby the spacers will fill the narrow openings. The first silicon oxide layer is partially etched away whereby the substrate within the central portions of the wide openings will be etched to form shallow trenches.

The patterned first silicon oxide layer and the first silicon nitride spacers are covered with a coating of a spin-on-glass material which is baked and cured. The spin-on-glass layer is etched back leaving the spin-on-glass material only within the wide openings within the shallow trenches. The first silicon nitride spacers are removed and deep trenches are etched into the silicon substrate under the first silicon nitride spacers whereby the deep trenches are formed at the location of the narrow openings and at the outside edges of the wide openings flanking the shallow trenches. The first silicon oxide layer and the spin-on-glass layer are removed.

A first thin silicon oxide layer is grown conformally on the sidewalls of the deep trenches. Channel-stops are selectively ion implanted into the substrate through the openings. The deep trenches are filled with a second silicon oxide deposit. A second thin oxide layer is deposited or grown over the surface of the substrate. A second layer of silicon nitride is deposited over the second thin oxide layer. A third silicon oxide layer is deposited over the second silicon nitride layer. Openings are etched through the third silicon oxide layer, the second silicon nitride layer, and the second thin oxide layer using the mask pattern. A third layer of silicon nitride is deposited over the surface of the substrate. The third silicon nitride layer is etched to leave a second set of silicon nitride spacers on the sidewalls of the patterned third silicon oxide layer, second silicon nitride layer, and second thin oxide layer.

Field oxide regions are grown on the surface of the substrate not covered by the patterned layers and the second set of silicon nitride spacers; that is, within the shallow trenches. The third silicon oxide layer, the second silicon nitride layer, the second set of silicon nitride spacers, and the second thin oxide layer are removed thereby completing the device isolation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
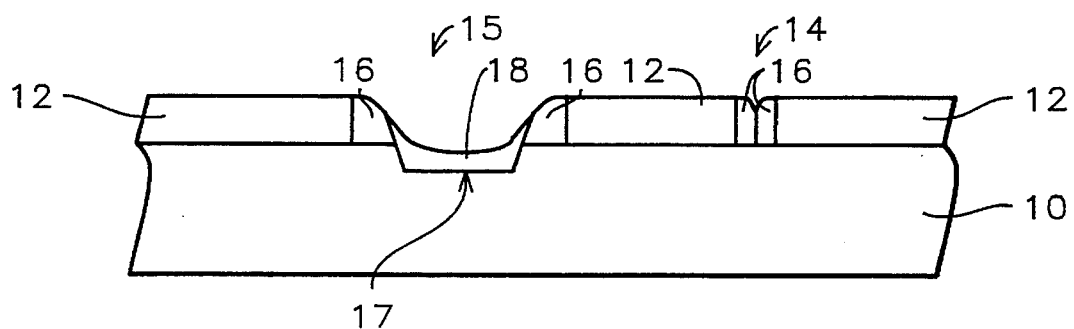
FIGS. 1 through 5 schematically illustrate in cross-sectional representation one preferred embodiment of this invention.

Referring now more particularly to FIG. 1, there is shown a monocrystalline silicon substrate 10. A layer 12 of silicon dioxide is deposited over the substrate by chemical vapor deposition to a preferred thickness of between about 4000 to 8000 Angstroms. A field oxide (FOX) mask pattern is laid over the surface of the substrate and the silicon dioxide layer is etched to provide narrow openings 14 and wide openings 15 to expose portions of the silicon substrate where the device isolation regions are to be formed. A layer of silicon nitride ($Si_3N_4$) 16 is deposited over the silicon oxide layer by chemical vapor deposition to a thickness of between about 3000 to 6000 Angstroms. The silicon nitride layer is etched to form spacers on the sidewalls of the silicon dioxide layer 12.

The substrate within the central portions of the wide openings 15 is etched using a reactive ion etch with $Cl_2$, $BCl_3$, $O_2$, or the like to form shallow trenches 17 to a depth of between about 2000 to 4000 Angstroms.

The patterned silicon oxide layer 12 and the silicon nitride spacers 16 are covered with a coating of a spin-on-glass material 18, either silicate or siloxane, which is baked and cured. The spin-on-glass layer is etched back leaving the spin-on-glass material only within the wide openings within the shallow trenches. The spin-on-glass material fills in the trenches with a smooth surface. Only a thin cured spin-on-glass layer is left over the trenches to be etched away.

Figure 2:
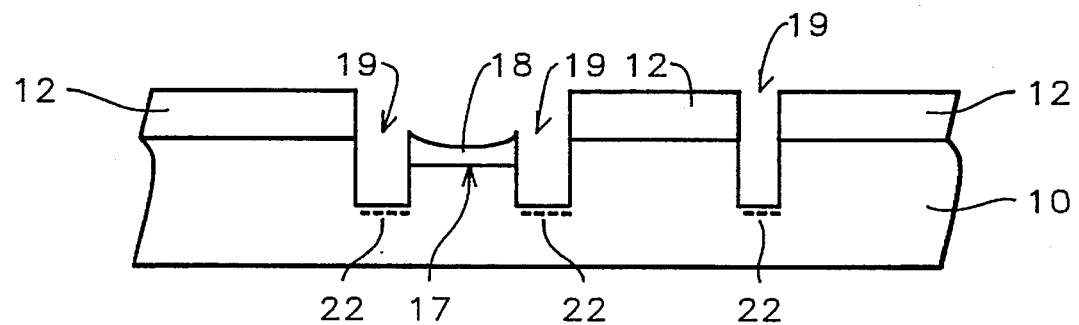

Referring now to FIG. 2, the silicon nitride spacers 16 are removed and deep trenches 19 are etched into the silicon substrate under the silicon nitride spacers. The deep trenches are formed at the location of the narrow openings 14 and at the edges of the wide openings 15 flanking the shallow trenches 17. The deep trenches 19 are etched into the silicon substrate to a depth of between about 6000 to 12,000 Angstroms.

Channel-stops 22 are selectively ion implanted into the substrate through the openings in the mask. Boron ions are implanted with a dosage of between about 1 E 13 to 1 E 14 atoms/$cm^2$ and at an energy of between about 10 to 50 KeV. The channel-stop implants serve to prevent inversion of p-type silicon under the field oxide.

Figure 3:
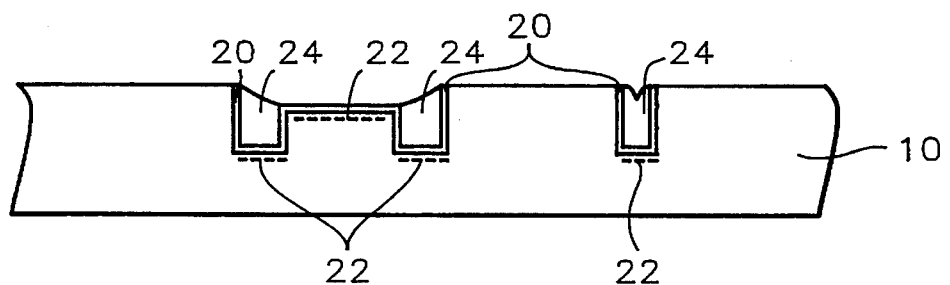

Referring now to FIG. 3, the silicon oxide layer 12 and the spin-on-glass layer 18 are removed by dipping the wafer into a hydrofluoric acid solution. A first thin silicon oxide layer 20 is grown conformally on the sidewalls of the deep trenches to a thickness of between about 50 to 500 Angstroms.

The deep trenches are filled with a second silicon dioxide deposit 24 with a thickness of between about 3000 to 6000 Angstroms. The silicon dioxide is etched back so that the oxide on the substrate surface and within the shallow wide trench is etched away.

Figure 4:
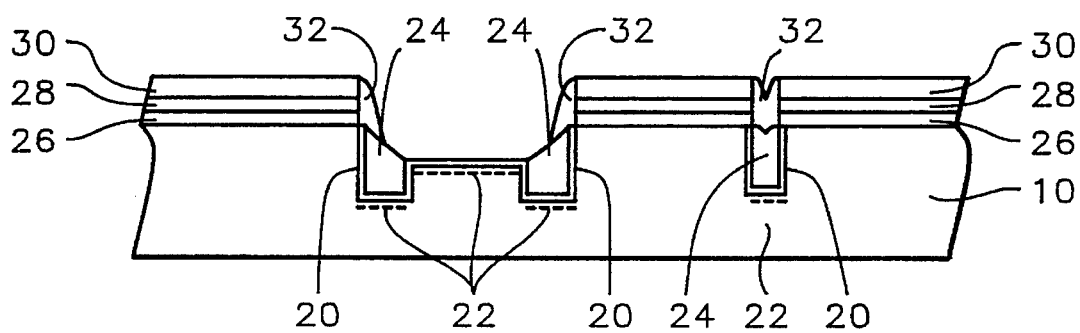

As shown in FIG. 4, a second thin oxide layer 26 is deposited or grown over the surface of the substrate. This layer has a preferred thickness of between about 50 to 300 Angstroms. A second layer of silicon nitride 28 is deposited over the second thin oxide layer to a thickness of between about 1000 to 2000 Angstroms. A third silicon oxide layer 30 is deposited over the second silicon nitride layer to a thickness of between about 1000 to 2000 Angstroms.

Using the same FOX mask, openings are etched through the layers 30, 28, and 26 by reactive ion etch using $C_2F_6$, $SF_6$, or the like.

A third layer of silicon nitride 32 is deposited over the surface of the substrate. The third silicon nitride layer is etched to leave a second set of silicon nitride spacers on the sidewalls of the patterned silicon oxide, silicon nitride, and thin oxide layers.

Figure 5:
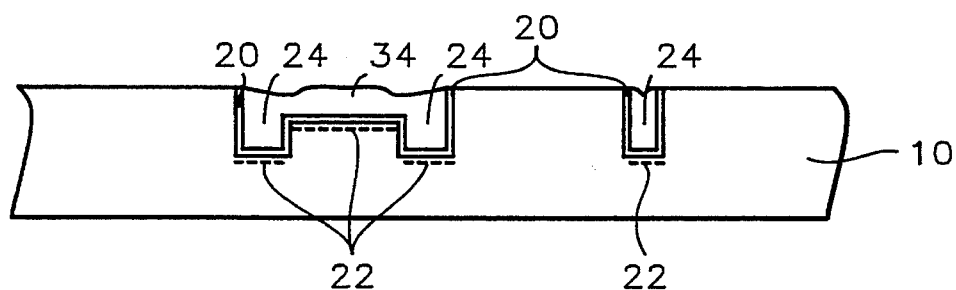

Referring now to FIG. 5, field oxide regions 34 are grown on the surface of the substrate not covered by the patterned layers 30, 28, and 26 or by the silicon nitride spacers 32; that is, within the shallow trenches 17. The field oxide regions are grown to a thickness of between about 4000 to 6000 Angstroms. The growth of the field oxide regions 34 also serves to drive in the underlying channel-stop regions 22.

The silicon nitride layer 28 and silicon nitride spacers 32 are stripped by dipping the wafer in phosphoric acid at a temperature of between about 150° to 180° C. This stripping will lift off the silicon dioxide layer 30 overlying the silicon nitride layers. The thin oxide layer 26 is removed by a hydrofluoric acid solution. Only about 300 Angstroms thickness of silicon dioxide is removed by dipping the wafer in a solution of $HF:H_2O=1:10$ for one minute.

This completes the device isolation of the integrated circuit. Both wide and narrow openings have been filled and planarized without thinning of oxide in narrow openings. No "bird's beak" or white ribbon effects are produced.

Figure 6:
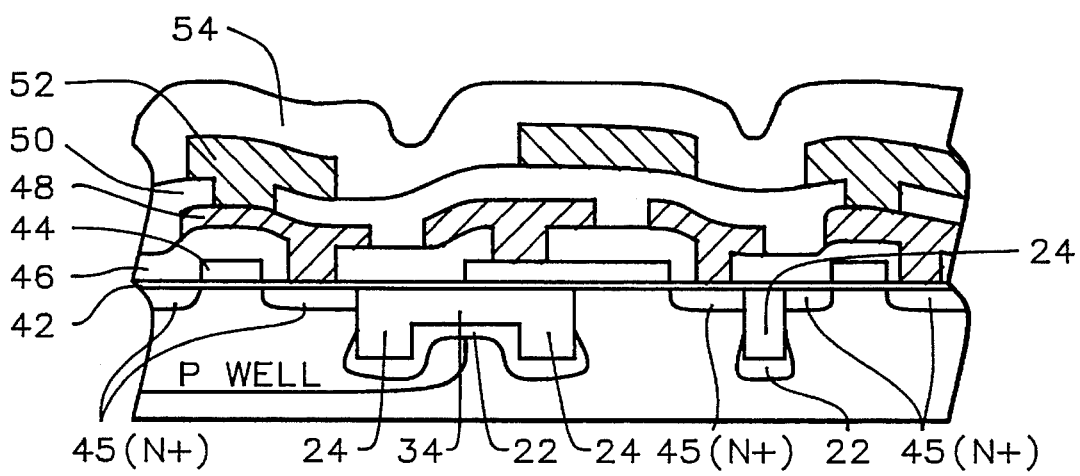
FIG. 6 schematically illustrates in cross-sectional representation a completed integrated circuit of the present invention.

The integrated circuit may be completed as is conventional in the art. For example, referring to FIG. 6, gate oxide layer 42 may be deposited followed by patterning to provide openings for buried contact regions. A threshold-adjust ion implant may be required at this point. Next, gate electrode 44 and source/drain regions 45 are fabricated. Dielectric layer 46, which may be a phosphorus-doped chemical vapor deposited oxide or borophosphosilicate glass (BPSG) is deposited. Contact openings are etched through the dielectric layer to expose the source/drain regions where contacts are desired. Metal layer 48, typically aluminum, is deposited and patterned to complete contacts to the source/drain regions followed by intermetal dielectric layer 50 and second metallization 52. A top capping layer 54 of silicon nitride and/or an oxide completes formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. A device isolation structure within a semiconductor substrate comprising:

narrow device isolation regions each consisting of a deep trench; and wide device isolation regions each consisting of two deep trenches flanking a shallow trench;
      wherein the top surface of said narrow and wide device isolation regions and said semiconductor substrate is planarized.

2. The device of claim 1 wherein a thin oxide covers the sidewalls and bottom of each of said deep trenches and wherein each of said deep trenches is filled with a silicon oxide.

3. The device of claim 1 wherein a thin oxide covers the sidewalls and bottom of each of said deep trenches and wherein each of said deep trenches is filled with a silicon oxide and wherein each of said shallow trenches is filled with a field oxide.

4. The device of claim 3 wherein said field oxide has no bird's beak structure.

5. The device of claim 1 wherein channel stop regions are formed underlying each of said deep and said shallow trenches.

6. A device isolation structure within a semiconductor substrate comprising:

narrow device isolation regions each consisting of a deep trench having a thin oxide covering its sidewalls and bottom and filled with silicon oxide;

wide device isolation regions each consisting of two deep trenches flanking a shallow trench wherein each deep trench has a thin oxide covering its sidewalls and bottom and is filled with silicon oxide and wherein said shallow trench is filled with a field oxide;

wherein the top surface of said narrow and wide device isolation regions and said semiconductor substrate is planarized.

7. The device of claim 6 wherein said field oxide has no bird's beak structure.

8. The device of claim 6 wherein channel stop regions are formed underlying each of said deep and said shallow trenches.

9. A device isolation structure within a semiconductor substrate comprising:

narrow device isolation regions each consisting of a deep trench having a thin oxide covering its sidewalls and bottom and filled with silicon oxide;

wide device isolation regions each consisting of two deep trenches flanking a shallow trench wherein each deep trench has a thin oxide covering its sidewalls and bottom and is filled with silicon oxide and wherein said shallow trench is filled with a field oxide having no bird's beak structure;

wherein the top surface of said narrow and wide device isolation regions and said semiconductor substrate is planarized.

10. The device of claim 9 wherein channel stop regions are formed underlying each of said deep and said shallow trenches.

* * * * *